United States Patent [19]

Bitter

[11] Patent Number: 4,490,227

[45] Date of Patent: Dec. 25, 1984

[54] PROCESS FOR MAKING A CURVED, CONDUCTIVELY COATED GLASS MEMBER AND THE PRODUCT THEREOF

[75] Inventor: Lowell E. Bitter, Holland, Mich.

[73] Assignee: Donnelly Mirrors, Inc., Holland, Mich.

[21] Appl. No.: 438,789

[22] Filed: Nov. 3, 1982

[51] Int. Cl.³ ............................................. C23C 15/00
[52] U.S. Cl. .................... 204/192 SP; 204/192 C; 204/192 R; 204/298; 427/58; 427/109; 428/432; 428/702
[58] Field of Search ................................ 427/58, 109; 204/192 SP, 298, 192 C; 428/702, 432

[56] References Cited

U.S. PATENT DOCUMENTS

| | | | |
|---|---|---|---|
| 2,954,454 | 9/1960 | Gaiser | 219/19 |
| 3,108,019 | 10/1963 | Davis | 117/201 |
| 3,282,815 | 11/1966 | Kay et al. | 204/192 |
| 3,506,556 | 4/1970 | Gillery | 204/192 |
| 3,655,545 | 4/1972 | Gillery | 204/192 |
| 4,021,218 | 5/1977 | Watanabe | 427/109 |
| 4,065,600 | 12/1977 | King et al. | 204/192 R |
| 4,201,649 | 5/1980 | Gillery | 204/192 R |
| 4,233,339 | 11/1980 | Leibowitz | 427/109 |
| 4,274,936 | 6/1981 | Love | 204/192 R |
| 4,395,467 | 7/1983 | Vossen et al. | 428/702 |

FOREIGN PATENT DOCUMENTS

| | | | |
|---|---|---|---|
| 566773 | 12/1958 | Canada | 204/192 |
| 0040076 | 5/1981 | European Pat. Off. | |
| 1446849 | 11/1973 | United Kingdom | 204/192 |

OTHER PUBLICATIONS

Raccanelli et al., J. Am. Ceram. Soc., 59, (1976), pp. 425–430.

Primary Examiner—Arthur P. Demers
Attorney, Agent, or Firm—Price, Heneveld, Huizenga & Cooper

[57] ABSTRACT

The specification discloses a method for making a curved, conductively coated glass member, and the resulting product, by providing for a sufficient degree of substoichiometry at the moment of bend that the glass can be bent using conventional bending techniques without crazing the coating. Two alternative methods for achieving the degree of substoichiometry are disclosed. One involves coating the part to an initial light transmittance ($T_o$) which is lower than that typically sought by prior artisans. The other involves bending the part in a reducing environment. Also disclosed is a method for increasing conductivity of the coating by exposing the coated part to a reducing environment at temperatures considerably higher than those heretofore thought feasible for use in reduction curing.

50 Claims, 4 Drawing Figures

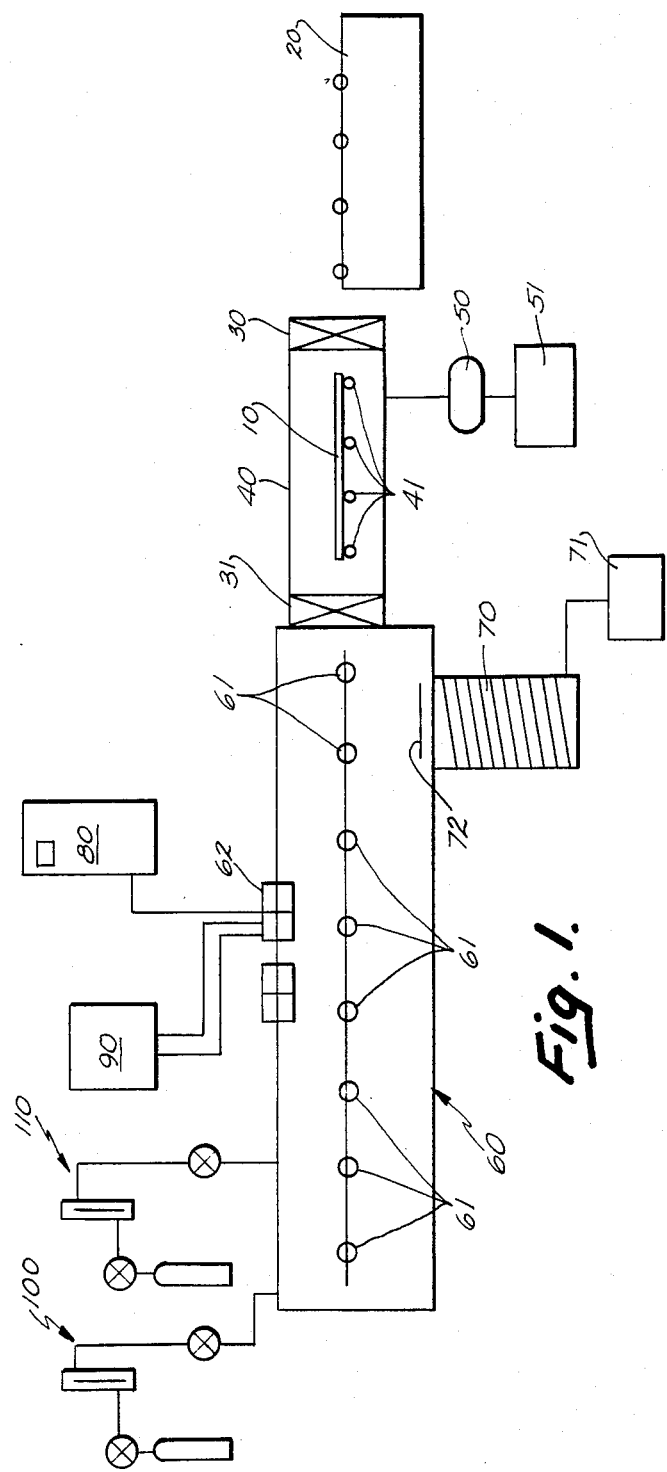
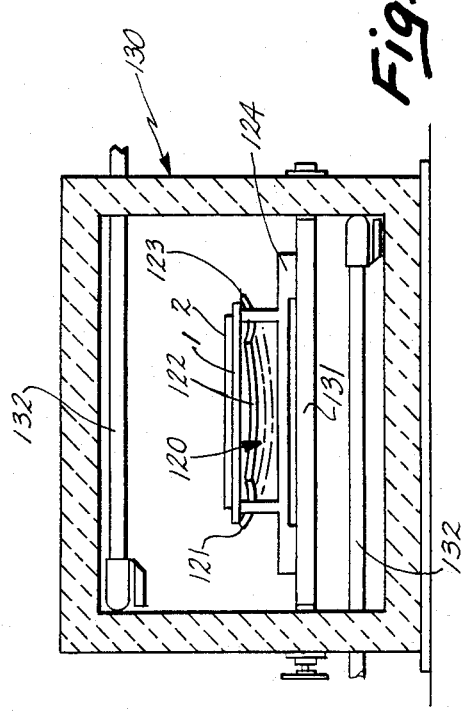
Fig. 1.
Fig. 4.

PROCESS II

PROCESS I

PROCESS FOR MAKING A CURVED, CONDUCTIVELY COATED GLASS MEMBER AND THE PRODUCT THEREOF

BACKGROUND OF THE INVENTION

The ultimate object of the present invention is to produce or make possible the production of a curved glass member having a transparent, electroconductive coating. The invention is particularly adapted to producing such a member for use in heating applications at low voltages relative to prior art. Such glass might be used for CRT screens which you can input by touching, architectural glass (such coatings are infrared reflective), curved, heated mirrors, and heated windows.

One possible application for such a product is automotive windshields. By applying a current to such windshields, accumulated frost, ice or fog can be removed by heating. It has been found that one should be able to generate 0.6 watts per square inch within a windshield of typical shape, with a space of 25" between the electrical bus bars, in order to clear rime ice 0.1" thick in about five minutes. Using a 60 volt auxiliary power source, which systems are readily available for use in automobiles, this means that the sheet resistivity of any coating on the glass must only be about 10 ohms per square.

Further, federal light transmissibility standard (FMVSS No. 205) requires a 70% minimum visible light transmission at an angle of 90° to the glass surface. Further, the electroconductive coating used, in order to be suitable in appearance, must be very thin, uniform, low in absorption, and low in reflection. These constraints make it particularly difficult to achieve such low resistivity. Assuming a coating with a range of index of refraction of 1.6 to 2.1, as is the case with indium-tin oxide coatings, a nominal full wave coating would have a physical thickness of approximately 3,400 to 2,600 angstroms (i.e., the median wave length for visible light, 5,500 Å, divided by the index of refraction).

There are no known commercially viable techniques available for providing satisfactory curved glass uniformly coated with such a thin film having such a low resistivity. Of course it is known to put transparent conductive coatings on aircraft windows, display cases and the like. Generally, however, flat glass is used in such applications. Also, high voltage power sources are available in such environments so that a high resistance in the film coating can be tolerated.

A common technique for preparing aircraft windows with electrically conductive coatings is to coat the hot surface of the glass with a tin oxide deposited pyrolytically. U.S. Pat. No. 2,954,454 discloses such a method for creating a coated, bent glass windshield. The problem with such a system is that in order to achieve coatings which make it possible to deliver 0.6 watts per square inch at low voltages, i.e., about 60 volts, one must provide a relatively thick film of between 5,000 and 10,000 angstroms. This results in a windshield or curved glass article which yields a "rainbow" of reflected color when exposed to light. This is partially due to the thickness of the coating, partially to the high index of refraction of tin oxide, and partially to the inherent nonuniform thickness of pyrolytically deposited tin oxide. Also it is suspected that such a process will yield a coating which will craze when the glass is bent, at least if produced on an economical commercial basis and using conventional bending procedures.

Indium-tin oxide has heretofore been sputter coated onto flat glass for use in liquid crystal display electrodes. However, when processed in accordance with conventional procedures, such indium-tin oxide, sputter coated flat glass cannot be bent on a viable production basis without crazing the indium-tin oxide coating. Such crazing of course interrupts the conduction of electricity and leads to serious imperfections in the heating pattern in the product.

United Kingdom Pat. No. 1,446,849, published Aug. 18, 1976, discloses the sputter coating of an already curved sheet of glass. Such a process would be very slow, and uniformity is believed to be a serious problem. It is not believed that such a process would be acceptable in commercial production.

As a result of such drawbacks, it is believed that prior artisans have not heretofore commercially produced electrically conductive curved parts for low voltage by glass coating processes. Further, even alternatives other than coating the glass, such as embedded wires or embedded conductively coated plastic films, have not proven commercially acceptable for heating applications where visibility is primary.

SUMMARY OF THE INVENTION

The present invention makes it possible to coat flat glass with a metallic oxide, bend it without crazing the film, and finish with a curved part yielding a power density satisfactory to achieve heating with a low voltage source, and having acceptable light transmission, absorption and reflective properties. This can be achieved on a commercially acceptable basis, both in terms of repeatability and in terms of time constraints.

I have found the key to making such a coated glass substrate bendable is to provide for a degree of substoichiometry in the oxide coating at the time of bend. The extent of substoichiometry must be sufficient to achieve the desired results, but not so great as to cause the final product to have less than 70% light transmission or be hazy. Two highly unique methods for achieving this result are disclosed herein.

In another aspect of the invention, I achieve very low resistance in relatively thin films by curing the coated glass substrate in a reducing environment at temperatures far in excess of those heretofore thought acceptable by prior artisans. While such curing increases light absorption in the resulting curved part, I have found that the increased absorption acts to reduce reflection without unduly interfering with the very high level of light transmission which has been achieved by the present invention.

These and other objects, advantages, and features of the invention will be more fully understood and appreciated by reference to the written specification and appended drawings.

BRIEF DESCRIPTION OF THE DRAWINGS

FIG. 1 is a schematic representation of a planar magnetron sputter coating apparatus of a type which can be used in this invention;

FIG. 4 shows schematically a glass bending frame and oven.

DESCRIPTION OF THE PREFERRED EMBODIMENT

In the preferred embodiment, process steps are followed which will ensure that the coated metallic oxide layer on a sheet of flat glass will have sufficient substiochiometry at the moment of bend to prevent the coating from crazing. I believe that the manner in which this is achieved is not critical. I have discovered two alternative approaches for achieving this result commercially.

Further, each of these methods includes a step of curing the coated glass by heating in a reducing environment (i.e., an inert gas, a reducing gas, or a vacuum environment) to temperatures far in excess of those heretofore thought acceptable. This enables me to substantially increase conductivity of the coating without adversely affecting light transmission. Indeed while absorption may be higher than encountered in prior art reducing techniques, as for example such as disclosed in U.S. Pat. No. 3,655,545 to Gillery et al, issued Apr. 11, 1972, the degree of light reflection is less, resulting in less glare.

I. FIRST ALTERNATIVE PROCESS

Figure 2:
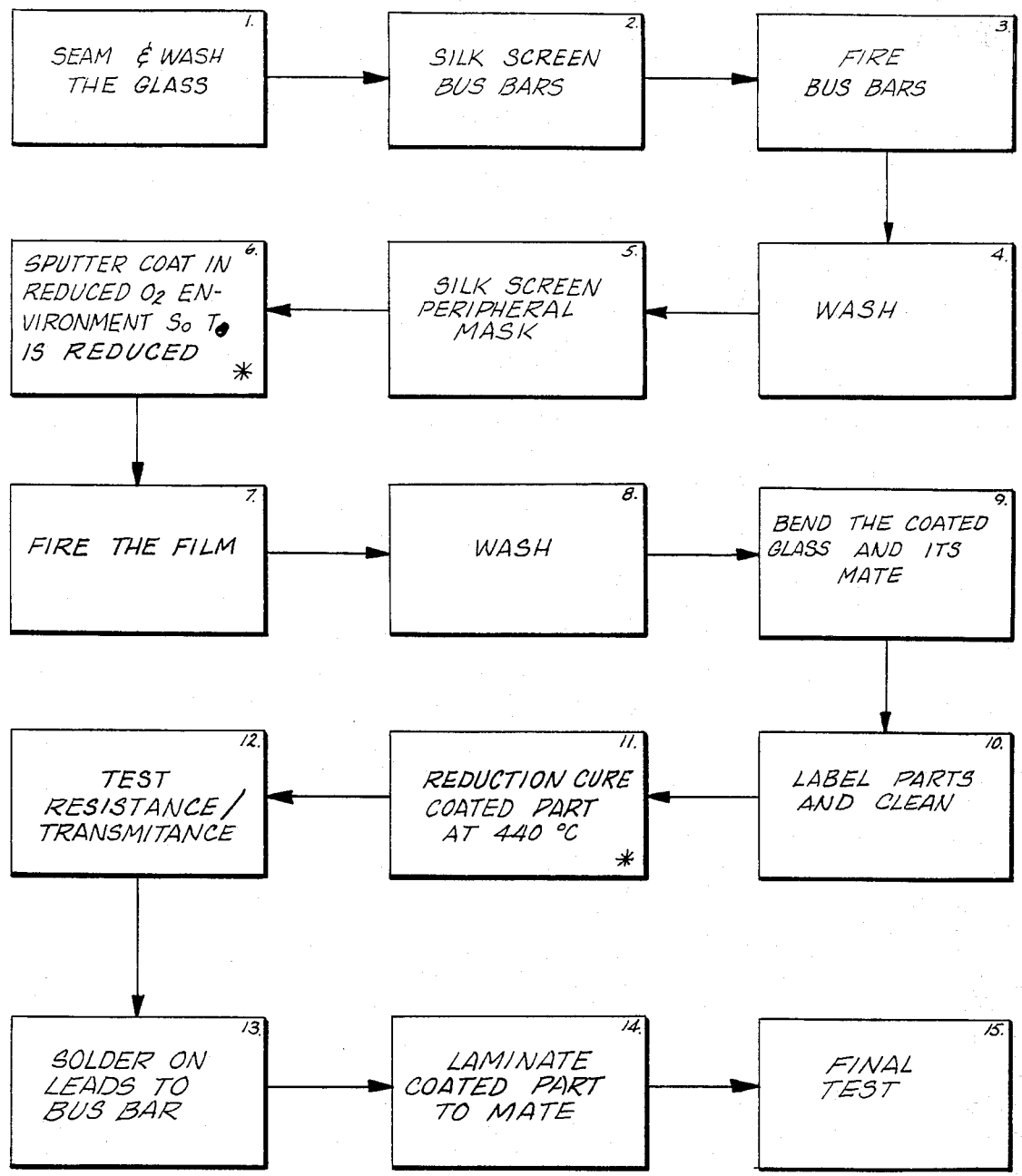
FIG. 2 is a flow chart showing the process steps in one process in accordance with the present invention.

FIG. 2 is a flow chart showing the basic steps employed in the first alternative embodiment process, in which sputter coating is used as the coating process. Except for the steps indicated by an asterisk, the process steps are generally carried on in a conventional manner. The first unique step (step 6 in FIG. 2) involves sputter coating the glass in a partial oxygen environment so that the initial light transmittance ($T_o$) (illuminant A) is significantly less than the $T_o$ previously sought by prior artisans, given their basic approach to coating.

By that it is meant that sputter coating is typically carried out on either an unheated substrate or on a heated substrate. Using a heated substrate, i.e., one heated to around 200° C., the processor seeks to create a completely transparent, coated glass substrate in a single step. Thus, the processor is seeking a substrate with an initial light transmission ($T_o$) in excess of about 87%. In my process, I seek a significantly lower $T_o$ using a heated substrate.

Sputter coating on an unheated substrate requires the use of two steps to get to the same point. The substrate is coated to an initial light transmittance which is in excess of 50%, typically around 60 to 70%. In order to increase the light transmittance, a subsequent oxidation step is employed (see Canadian Pat. No. 566,773 entitled "TRANSPARENT CONDUCTING FILMS" issued to John S. Preston on Dec. 2, 1958).

In my first alternative embodiment process, I use a reduced oxygen environment and sputter coat an unheated substrate to a $T_o$ of no more than about 40%. In the case of a heated substrate, I can allow $T_o$ to be greater, i.e., as much as about 75%. Both of these are significantly less than the typical 60% for unheated substrate or typically 87% plus for a heated substrate which are pursued by prior artisans. I prefer using an unheated substrate since I find I have less haziness in my final product.

I have found that by providing for a reduced $T_o$, I am able to bend the coated glass without crazing, even though considerable oxidation takes place when the glass is fired prior to bending. The firing step increases light transmission nominally to 85% for the full wave coating. This indicates that some oxidation has occurred. Yet, the parts still have sufficient substiochiometry at the moment of bending that they can be bent without crazing. If one sputter coats the parts in more oxygen using this process so that $T_o$ exceeds 40% for a nonheated substrate to about 75% for a heated substrate as is conventional, the coatings almost always craze during the bending step.

The second unusual step in this process (step 11 in FIG. 2) involves reducing the coated part at above 400° C., preferably about 440° C., which is substantially higher than the about 340° C. thought to be the maximum acceptable by prior artisans. This reducing step is conducted either in an inert gas atmosphere or in a mildly reducing gas containing hydrogen or the like or in a vacuum at temperatures in excess of 400° C., and preferably about 440° C. The result of the combination of these unique steps and the other more conventional steps is a sheet of curved glass which can have a relatively thin coating, e.g., 2,800 angstroms, and still yield desirable power density because of its 10 ohm per square sheet resistance.

Step 1, FIG. 2, of the process involves seaming and washing the long, cut part. A slightly shorter part is provided as the mate for the longer part and is similarly seamed and washed.

Step 2 involves silk screening electrically conductive bus bars along the top and bottom edges of the long flat piece of seamed glass. This is followed by the conventional step of firing the bus bars in a conventional firing oven (step 3). The part is again washed (step 4) and is ready for step 5 wherein a peripheral zone mask is silk screened onto the part. This is a conventional paint mask, and is intended to prevent the peripheral edges of the glass from becoming coated with a conductive film. This prevents the conductive element from being accidently grounded onto any contiguous conductive material.

Step 6 involves sputter coating an unheated long glass part to the desired thickness in a partial oxygen atmosphere so that the initial light transmittance, $T_o$, is less than about 40%. Planar magnetron sputtering is a well-known coating method. The subject is discussed in prior publications such as "Planar Magnetron Cathodes-Past, Present, and Future", Theodore Van Vorous, published by Vac-Tec Systems, Inc., Boulder, Colo.; U.S. Pat. No. 4,046,659 issued Sept. 6, 1977 to Cormia et al.; U.S. Pat. No. 4,022,947 issued to Grubb et al., on May 10, 1977; and Canadian Pat. No. 566,773 issued to Preston on Dec. 2, 1958.

Basically, in typical cathodic sputtering processes, a high negative potential is applied to a cathode assembly which is comprised of the metal(s) sought to be deposited on a substrate, typically glass. The substrate is located in the vicinity of and substantially parallel to the cathode assembly in a vacuum chamber with a low pressure (about $5 \times 10^{-3}$ torr) atmosphere of oxygen and inert gas such as neon, argon, krypton or xenon. The high potential and reduced pressure cause a glow discharge between the cathode and the anode. Under such conditions, the gas is energized and the gaseous ions strike the cathode causing metal ions to be ejected from the cathode and deposited on the surface of the substrate. This process is enhanced where a magnetic field is present which magnetically confines the glow discharge plasma. (i.e., a planar magnetron is employed).

FIG. 1 shows schematically a typical planar magnetron sputtering apparatus of the type which can be used in practicing the present invention. The part to be coated is placed on a tray 10, located initially on feed table 20, and is passed through an opened gate valve 30 into a load lock 40 having a second gate valve 31 at its other end. A vacuum booster 50 and backing pump 51 are used to evacuate load lock 40 with both gate valves 30 and 31 closed. When the desired vacuum is achieved, load lock 31 is opened and the tray 10 carrying the part to be coated is transported into the evacuated sputtering chamber 60, from motor driven rollers 41 onto motor driven rollers 61.

Vacuum is maintained within sputtering chamber 60 at all times during operation by means of diffusion pump 70 and backing pump 71. A throttle 72 is typically used to help control the vacuum. Tray 10 and the part it carries are passed back and forth on motorized rollers 61 beneath the sputtering target or cathode assembly 62 for as many times as is necessary to coat the part to a desired thickness.

Power to the cathode or target 62 is provided by power supply 80. Target 62 is cooled through a regenerative water cooling system 90. Argon and oxygen are supplied to sputtering chamber 60 by assemblies 100 and 110 respectively.

The composition of the indium-tin cathode 62 is conventional. A tin level of from 1 to 25% is typical, with 9% or 10% optimum. I use a 10% tin, 90% indium target.

It is well-known that the degree of light transmission of the coating, after the sputtering process is complete, is a function of the extent to which the metal has been oxidized as it coats the glass substrate surface. This degree of oxidation is in turn controlled by the relative amount of oxidizer and reaction activating influences (such as substrate biasing, e.g., positive, negative, R.F.) available in the vacuum chamber. What is not known by prior artisans, however, is that by reducing the amount of oxygen and extent of oxidation so that the initial light transmittance, $T_o$, for an unheated substrate, is less than about 40%, (less than about 75% for heated substrate) the coated part can subsequently be bent without crazing the coating.

To produce acceptable parts with respect to heating uniformity and appearance, it is also important that the indium-tin oxide film be relatively uniform in thickness across the surface of the parts. Preferably, the thickness should not vary more than about ±7.5%. Such uniformity can be achieved using conventional sputtering techniques, particularly in view of the fact that the present invention contemplates sputter coating a flat part, rather than a curved one.

The amount of oxygen is controlled so that $T_o$ for an unheated substrate is less than about 40%, and preferably approximately 20% generally everywhere in the coating (less than 75%, preferably about 55% for a heated substrate). Naturally, some variation will be experienced, particularly with variations in film thickness. I have found that $T_o$ can vary as much as about ±10% across the part without adversely affecting the objectives of the present invention. $T_o$ should not be driven below about 10%, because it is too difficult to subsequently oxidize the film to yield a good, uniformly clear, haze free final product.

For purposes of clarity of the final product, the coating should be as thin as possible. Maximum transmission is achieved when the optical film thickness is an integral multiple of one-half of the nominal wavelength of visible light. Variations at other than integral multiples of half wave films will tend to reduce transmission and change the reflected color. Going to a 1.5 wavelength coating, one can achieve the desired film conductivity more easily since, for a given bulk resistivity, a thicker film will be more conductive than a thinner film. However, one undoubtedly sacrifices some light transmission in the final product. I have produced two wave coatings, which can be bent without crazing and believe that even thicker coatings, e.g., three wave, could be produced without crazing. Going to a half wavelength coating affords some improvement in transmission, but results in a more resistive film because it is thinner (assuming everything else is constant). This makes it more difficult to achieve the ultimate desired power density. Hence a full wave coating has been found quite desirable in the present invention.

As is known to those skilled in the art, the part is passed back and forth beneath the sputtering target until the desired film thickness has been achieved. The number of passes to yield a desired film thickness will of course vary from specific apparatus to specific apparatus, and in accordance with other variations in process parameters. I have found that variations in these parameters, and indeed, variations in the number of times that the part has to be passed beneath the sputtering target, have little or no effect on the desirability of achieving an initial $T_o$ of from about 10% to about 40% for an unheated substrate.

The desirability of achieving an initial $T_o$ of less than about 40% is relatively independent of film thickness. At a given $T_o$ of less than 40%, the bulk resistivity (or specific resistivity) achieved in the film will be approximately the same without regard to whether a full wave or 1.5 wave film is applied to the part.

As will be appreciated by those skilled in the art, the various settings for argon pressure, oxygen pressure, power density to the cathode sputtering target, and other such settings may vary from machine to machine and from procedure to procedure used in order to achieve the desired $T_o$ or an unheated substrate of less than about 40%. Of course, it is appreciated by those skilled in the art that the primary factor to be controlled is the quantity of oxygen present. Further, it is perphaps significant to other operational parameters that the object of this invention is achieved primarily as a function of $T_o$, regardless of other process variations such as power density to the cathode or anode, argon pressure, or the like. Naturally, variation of these factors may have other process ramifications, but they do not seem to alter the fundamental desirability of achieving a $T_o$ of between about 10 and about 40% for an unheated substrate.

Other problems, unrelated to the essential object of the present invention may show up by varying these factors. I typically deposit the coating without auxiliary substrate heating (the sputtering process itself may ward the glass somewhat). Others may wish to use such auxiliary heat for various reasons. Such heating is one example of a reaction activating influence which will modify the transmission and absorption of the as-deposited film. My work indicates that such heating allows films of higher $T_o$, i.e., about 75% for substrate heated to 200° C. to survive bending without crazing, but is attended by other undesirable results for the product. Heating the substrate during coating is a more time consuming and I believe complicated process. I have difficulty eliminating haze from such a coating. In any event, such heating, while allowing for an initially higher transmittance ($T_o$), does not result in a stoichiometric, crazing film at bending. The essential element, again, is a degree of substoichiometry at the moment of bend, which is achieved in this embodiment by beginning with a $T_o$ which is lower than that pursued by prior artisans pursuing comparable coating procedures.

Power density to the cathode or anode can be varied as desired by the operator. Some may wish to use various power densities in order to improve the rate of production. Suffice it to say that for purposes of the present invention, such power density variations do not alter the fundamental desirability of achieving a $T_o$ of between about 10 and about 40% for an unheated substrate and between about 10 and 75% for a heated (200° C.) substrate.

After the part is coated, it is fired at approximately 540° C. (for soda lime glass) to sufficiently oxideize the film (step 7). This also oxidizes the peripheral mask. This is done in the presence of an oxidizing atmosphere, in order to oxidize the film and the mask, and takes about three to six minutes above 500° C. For temperatures less than 500° C., longer times are needed. The light transmission in increased to about 85% as a result of this step. The coated glass exhibits a light absorption of from about 1.7 to about 10% after firing. There is still sufficient substoichiometry in the coating that crazing is avoided during the subsequent bending step.

Step 7 would not have to be used for oxidation of the coating if the substrate were heated during coating. However, some means for removing the mask would have to be employed.

In step 8, the oxidized paint mask is removed. As is conventional in the bending process, the two pieces which are to be later assembled into a single part are bent together. The longer piece is typically placed on the bottom and is dusted with a suitable parting medium such as talc. The shorter piece is placed on top. The two are placed in a bending fixture 120 (FIG. 4). Such fixtures are conventional and generally comprise several hinged segments, 121, 122, and 123 as shown, which in turn are hingedly mounted at some point to a base support 124. The particular shape of the hinged segments will vary depending on the final shape desired for the part. The longer flat piece 1 is placed in the fixture such that it extends between the ends thereof as generally shown in solid lines in FIG. 4, with the shorter piece 2 on top. The entire fixture 120 and parts 1 and 2 are then passed on a conveyor 131 into oven 130. Heat is supplied by heating elements 132 as is conventional. The glass is heated in the oven to a temperature just sufficiently near its softening point to cause it to sag down into the hinged segments 121, 122, and 123 of the bending fixture until it comes to rest against the edges of hinged segments 121, 122, and 123. The sagged or bent condition for the parts and the hinged segments 121, 122, and 123 is indicated in phantom lines in FIG. 4.

This procedure is entirely conventional and can be carried on in a conventional way without crazing the indium-tin oxide coating. In that regard, however, it is important to the present invention that the heating parameters of a conventional glass bending procedure not be exceeded. It is typical to elevate the temperature of conventional soda lime glass to about 590° C., i.e., 40° C. below its softening point, for bends of 12 to 60 inch radius. This causes the glass to sag and take its shape within a few minutes of reaching this temperature.

If unusual bending procedures are followed, however, specifically if the temperature of the substrate is allowed to substantially exceed these ranges near the softening point of the glass, thereby causing the glass to sag more rapidly and perhaps substantially beyond the planes defined by the edges of the bending frame 120, crazing of the indium-tin oxide coating will tend to occur.

The occurrence of this crazing is not a function of temperature per se, but of the rapidity with which the glass is caused to sag or bend. Thus, I have found that no crazing occurs when conventional soda lime glass is heated to about 590° C., the softening point of such glass being about 630° C. At more elevated temperatures, crazing occurs on conventional soda lime glass.

Yet, crazing does not occur (for the low $T_o$ coating) during the bending of borosilicate glass at temperatures of about 650° C. The softening point of borosilicate glass is approximately 820° C. At this temperature, the borosilicate glass bends at about the same rate as conventional glass does at 590° C. The rate at which the glass is allowed to sag or bend, then, is a critical parameter.

Indeed one can minimize the possibility of crazing in the coating even further by reducing the speed at which the part is allowed to bend. At very, very slow rates, even high $T_o$ coatings will not craze. Of course, it is impractical and not economical to bend at extremely slow rates.

Thus, the present invention is intended to facilitate conventional bending of the part in accordance with conventional techniques without crazing. In that regard too, it is significant that conventional glass bending in this way results in a part having a gradually curved surface rather than very sharp cornes or radii. I have found that crazing tendency is enhanced for sharp bends, e.g., less than about 12" radius.

After bending, the two parts are separated, labeled for later reassembly, and cleaned (step 10, FIG. 2). The coated, longer part is then reduction cured (step 11, FIG. 2). The coated, bend part is placed in an oven and heated to in excess of 400° C., preferably about 440° C., for about 20 minutes. During this time, the part may be exposed to a mildly reducing atmosphere, consisting of about 95% nitrogen and about 5% hydrogen. Heating to this temperature in simply an inert gas such as nitrogen, or in a vacuum, will achieve the same desired result, but must be conducted for a longer period of time, approximately an hour, as opposed to 20 minutes when a reducing gas is included in the gas mixture, e.g., 5% hydrogen.

This postbend reduction step lowers the refractive index (real portion) of the ITO film and imposes an index gradient on that film, with the lowest index being at the film surface away from the glass, I believe. It also increases film absorption. For typical levels of reduction, this results in increased film absorption (about 5%) and some decrease in film reflection and transmission. The particular values will depend upon exact film thickness and degree of reduction, but typically (for non-tinted glass), the transmission would be about 86% as bent with absorption of 1%. After curing transmission would be about 84% and absorption about 5%. However, in the final laminated product, the upper film surface contacts the plastic interlayer reducing substantially the light reflected by the film. This results in a final part with desirable optical properties, i.e., high transmission, low reflection, and a subtle reflected color. Final transmission of about 85% is typical for single strength clear glass in a laminated unit.

Most importantly, this reduction curing step yields a coating which is highly conductive in spite of its high degree of light transmission. We have found that the sheet resistance in a full wave coating (2,800 angstroms thick) is approximately 9 ohms per square. This is a bulk or specific resistivity of only about $2.5 \times 10^{-4}$ ohm cm. A prior artisan who has reported achieving a sheet resistivity approaching 10 ohms per square is Gillery in U.S. Pat. No. 3,655,545, and that was in a coating having a thickness of about 6,000 angstroms. This would be a specific or bulk resistivity of approximately $6 \times 10^{-4}$ ohm cms.

After the coated part has been reduction cured, it is tested for resistance and transmittance (step 12, FIG. 2). Leads are then soldered onto the previously applied bus bars (step 13). The coated part and its similarly curved mate are then laminated together in a conventional manner using an intermediate polybuterate plastic sheet (step 14). After final testing, the product is ready for shipment to the customer.

II. SECOND ALTERNATIVE PROCESS

Figure 3:
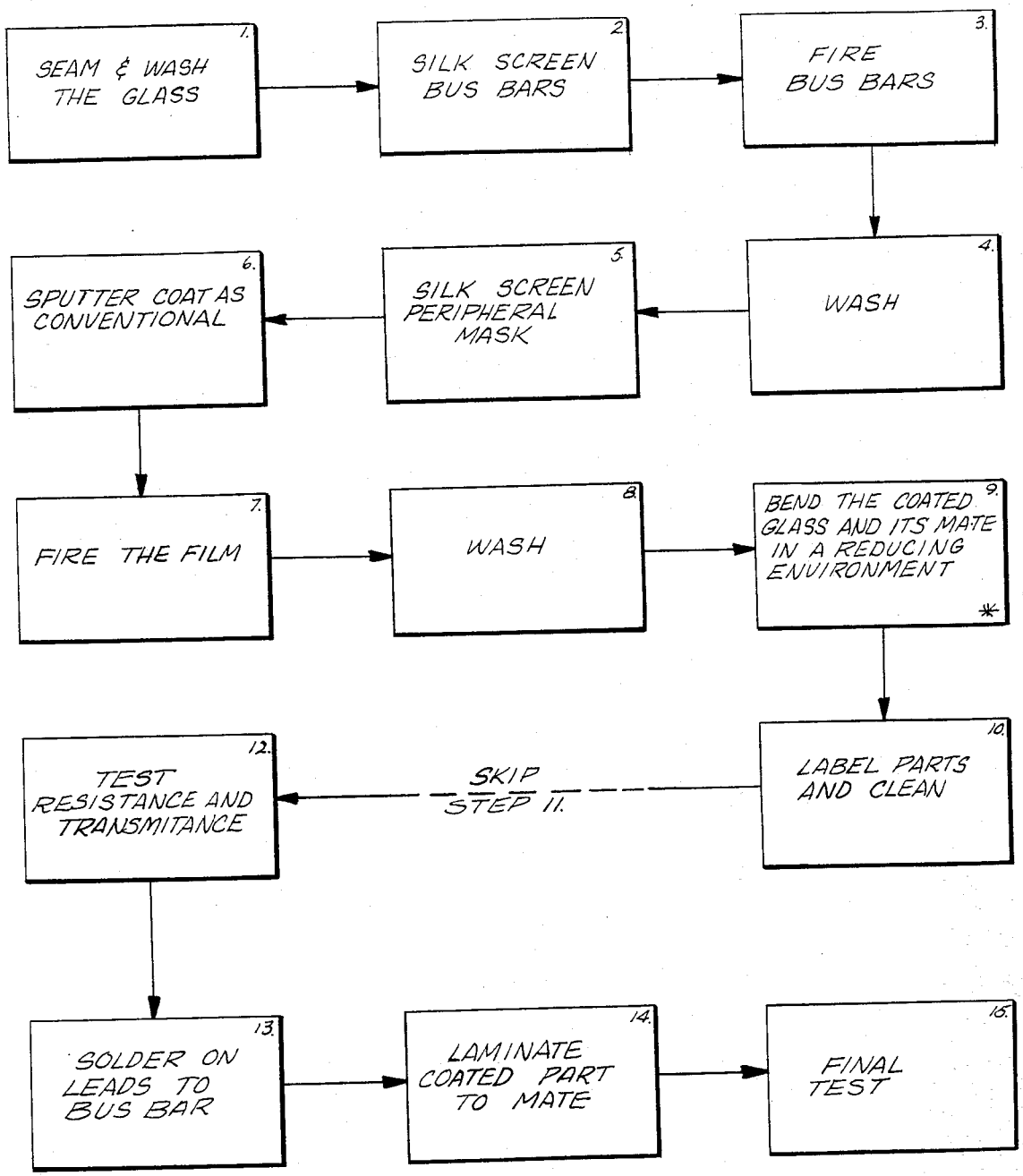
FIG. 3 is a flow chart showing the steps in a second process in accordance with the present invention.

FIG. 3 shows a second alternative process by which a degree of substoichiometry can be achieved in the indium-tin oxide coating at the moment of bend. The key differences between the two processes occur at steps 6 and 9, and in the elimination of step 11 from Process I. All of the other steps in the process correspond identically to the correspondingly numbered steps in Process I.

Referring to step 6, it will be noted that in the second process alternative, the longer part may be sputter coated as is conventional to a $T_o$ which for a nonheated substrate is in excess of about 40%. As noted previously, $T_o$ for a nonheated substrate is typically around 60% after sputtering. Thus a conventional sputter coating step is used instead of the reduced oxygen step called for in Process I.

Turning to step 9, it will be noted by the asterisk in FIG. 3 that in Process II, the bending step is unusual whereas in Process I, the bending step is conventional. The key to the uniqueness of the bending step in Process II is that the glass and its mate are bent in a reducing environment. Further, one should reverse the position of the parts so that the indium-tin oxide coating is exposed to the reducing environment. The shorter part is placed on the bottom, dusted with a parting medium such as talc, and the longer, coated part is placed on top of the shorter part with its coating surface up.

It should also be noted that in step 7 (assuming a nonheated substrate during coating) we must insure that firing achieve sufficient oxidation that excessive reduction does not result during reduction bending. I have found that the firing of Process I will be adequate for this.

The bending frame 120 with the parts so arranged are introduced into an oven (Lehr TM) which is preferably filled with a mildly reducing gas. Basically, the same gas used in step 11 in Process I can be used in step 9 in Process II. This causes reduction of the coating as the glass is heated to bend. This ensures a degree of substoichiometry at the moment of bend and thereby prevents or substantially minimizes crazing of the coating as the part bends.

In all other respects, in terms of timing and the like, the bending process is carried on as described previously. All of the other parameters discussed in connection with step 9 for Process I are applicable in step 9 for Process II.

It is not absolutely essential to use a reducing gas in the bending step. The reducing environment could also be created by means of a vacuum or inert gas. The bending step is conducted in the same manner as described above, except that the bending oven is evacuated or filled with inert gas rather than being filled with a reducing gas.

Because substantial reduction takes place during this bending step, there is no necessity, typically, of conducting the reduction curing step of Process I (step 11 in FIG. 2), provided subsequent film oxidation is prevented. Hence FIG. 3 shows that step 11 is skipped. The part resulting from Process II has a light transmittance before lamination of from about 78% to about 80%, a light absorption of from about 7% to about 10%, and a light reflectance of from about 12% to about 13%. The sheet resistance achieved in a full wave film is approximately 7 to 10 ohms per square.

Process II has the advantage of using a conventional sputter coating step and eliminating the curing step. However, it is somewhat more difficult to conduct the bending step in a reducing environment. A special oven or the like will be required.

III. POSSIBLE VARIATIONS

As one possible variation, it is noted that some oxidation of the coated part may in connection with Process II, under some circumstances, as for example if the coating is accidentally overreduced, be necessary subsequent to the actual bending in order to achieve a sufficient degree of transparency. I have not had to do this, but can visualize that it might be a necessity given other variations in process parameters. Hence as the glass cools down after bending, one might reintroduce air into the system to cause some reoxidation of the reduced coating.

While sputter coating is the preferred method of coating, I know of no reason that the present method broadly would not work with other coating techniques to minimize crazing. Evaporation, pyrolytic deposition and chemical vapor deposition are alternative possible coating methods. Pyrolytic and chemical vapor deposition have the advantage of being operable at atmosphere pressure, whereas sputter coating and evaporation coating must be done in a vacuum. Different approaches to insuring substoichiometry at bend might be necessary due to peculiarities of the different coating techniques.

IV. CONCLUSION

The above distinctly different alternative approaches for achieving a bendable metallic oxide coated part on a commercially feasible basis, which will have sufficient conductivity to enable one to generate 0.6 watts per square inch at 60 volts for 25 inch bus bar separation, share a key mechanism in common. Both cause the indium-tin oxide coating to have a slight degree of substoichiometry at the moment of bend. Precisely measuring that degree of substoichiometry during bending is difficult. However, it is known that the two processes as described will achieve the necessary degree of substoichiometry to facilitate bending without crazing. Other procedures may also be apparent to those skilled in the art. It is of course understood that the above are merely preferred embodiments of the invention and that various changes and alterations can be made without departing from the spirit and broader aspects thereof as set forth in the appended claims.

The embodiments of the invention in which an exclusive property or privilege is claimed are defined as follows:

1. A process for making an electrically conductive bent substrate which includes coating a generally flat part with indium-tin oxide and subsequently bending same, said process further comprising: providing for at least sufficient oxygen substoichiometry at the moment of bend that the indium-tin oxide coating doesn't craze during bending, but not so great a substoichiometry that the final product has less than 70% light transmission or is hazy.

2. The process of claim 1 which includes a reduction curing step wherein the coated substrate is exposed to a reducing environment at a temperature in excess of about 400° C.

3. The process of claim 2 in which said reduction step is performed for sufficient time to give the coating a specific resistivity of less than $3 \times 10^{-4}$ ohm cm.

4. The process of claim 3 wherein said coating has a thickness of between about one-half to about three wavelengths based on the median wavelength of visible light.

5. The process of claim 1 in which said substrate is glass and said bending step is conducted at typical heating and bending rates for such glass.

6. The process of claim 4 in which said substrate is glass.

7. The process of claim 6 in which said coating is achieved by sputter coating.

8. The process of claim 1 in which said substoichiometry is achieved by sputter coating a substantially unheated substrate with indium-tin oxide to an initial light transmittance of between about 10 and about 40%, and avoiding complete oxidation thereafter at least until after said substrate is bent.

9. The process of claim 1 in which said substoichiometry is achieved by sputter coating a heated substrate with indium-tin oxide to an initial light transmittance of between about 10% and about 75%, and avoiding complete oxidation thereafter at least until after said substrate is bent.

10. The process of claim 9 in which said coated substrate is heated in an oxidizing environment sufficiently to lower the level of light absorption to from about 1.7 to about 10%.

11. The process of claim 10 which includes a post bending reduction curing step in which the bent coated substrate is heated to in excess of about 400° C. in a reducing environment.

12. The process of claim 11 in which said bent substrate is heated to about 440° C.

13. The process of claim 12 in which said reduction step is performed for sufficient time to give the coating a specific resistivity of less than $3 \times 10^{-4}$ ohm cm.

14. The process of claim 13 wherein said coating has a thickness of between about one-half to about three wavelengths based on the median wavelength of visible light.

15. The process of claim 11 in which said reduction step is performed for sufficient time to give the coating a specific resistivity of less than about $3 \times 10^{-4}$ ohm cm.

16. The process of claim 15 wherein said coating has a thickness of between about one-half to about three wavelengths based on the median wavelength of visible light.

17. The process of claim 16 in which said substrate is glass.

18. The process of claim 15 in which said substrate is glass.

19. The process of claim 14 in which said substrate is glass.

20. The process of claim 13 in which said substrate is glass.

21. The process of claim 12 in which said substrate is glass and said coating is indium-tin oxide.

22. The process of claim 11 in which said substrate is glass.

23. The process of claim 9 in which said substrate is glass.

24. The process of claim 1 in which said substoichiometry is achieved by exposing the indium-tin oxide layer to a reducing environment as the substrate is heated to bending.

25. The process of claim 24 in which the substrate is coated to an initial light transmittance in excess of about 40%.

26. The process of claim 25 in which said initial light transmittance is in excess of about 60%.

27. The process according to claim 24 in which said coating on said substrate is reduced sufficiently during bending to have a specific resistivity of less than about $3 \times 10^{-4}$ ohm cm.

28. The process of claim 27 wherein said coating has a thickness of between about one-half to about three wavelengths based on the median wavelength of visible light.

29. The process of claim 28 in which said substrate is glass and said bending step is conducted at typical heating and bending rates for such glass.

30. The process of claim 24 in which said substrate is glass and said bending step is conducted at typical heating and bending rates for such glass.

31. The process of claim 27, in which said substrate is glass.

32. The process of claim 31 in which said coating is achieved by sputter coating.

33. The process for making an electrically conductive bent glass which includes sputter coating a generally unheated, generally flat glass with indium-tin oxide and subsequently bending same, said process including: conducting said sputter coating in a reduced oxygen environment so that the initial light transmittance of the coating following completion of the coating step is between about 10 and about 40%; bending said substrate in air; and thereafter heating the bent substrate to in excess of 400° C. in a reducing environment.

34. The process of claim 33 in which said bent substrate is heated to about 440° C. in a mildly reducing gas and held there for about 20 minutes.

35. The process of claim 34 in which said reduction step is performed for sufficient time to give the coating a specific resistivity of less than $3 \times 10^{-4}$ ohm cm.

36. The process of claim 35 wherein said coating has a thickness of between about one-half to about three wavelengths based on the median wavelength of visible light.

37. The process of claim 36 in which said substrate is glass and said bending step is conducted at typical heating and bending rates for such glass.

38. The process of claim 35 wherein said coating has a thickness of between about one-half to about one and one-half wavelengths based on the median wavelength of visible light.

39. The method of claim 37 which includes firing the substrate in atmosphere to a temperature of in excess of about 500° C. but below the softening point of the glass for no more than about three to six minutes.

40. The method of claim 36 which includes firing the substrate in atmosphere to a temperature of in excess of about 500° C. but below the softening point of the glass for no more than about three to six minutes.

41. The method of claim 35 which includes firing the substrate in atmosphere to a temperature of in excess of about 500° C. but below the softening point of the glass for no more than about three to six minutes.

42. The method of claim 34 which includes firing the substrate in atmosphere to a temperature of in excess of about 500° C. but below the softening point of the glass for no more than about three to six minutes.

43. The process for making an electrically conductive bent glass which includes sputter coating a generally flat glass substrate with indium-tin oxide and subsequently bending same, said process further comprising: said coating step including initially coating the substrate to an initial light transmittance of greater than 40%; said bending step including exposing the metallic oxide layer to a reducing environment as the substrate is heated to bending.

44. The process of claim 43 in which said initial light transmittance is in excess of about 60%.

45. The process according to claim 44 in which said coating on said substrate is reduced sufficiently during bending to have a specific resistivity of less than $3 \times 10^{-4}$ ohm cm.

46. The process of claim 45 wherein said coating has a thickness of between about one-half to about three wavelengths based on the median wavelength of visible light.

47. The process of claim 46 in which said substrate is glass and said bending step is conducted at typical heating and bending rates for such glass.

48. A process for fabricating a curved windshield having an electrically conductive coating suitable for generating approximately 0.6 watts per square inch using a 60 volt power source and having at least 70% minimum visible light transmission at an angle of 90 degrees, comprising:
coating a relatively thin indium-tin oxide film of a thickness of between one-half to about three wavelengths based on the median wavelength of visible light on a generally flat glass windshield blank;
heating and bending the thus-coated glass windshield blank while said indium-tin oxide film is in an oxygen substoichiometric state of sufficient degree that said film bends in substantial conformity with said glass windshield blank without crazing to form said curved windshield.

49. The process of claim 48 wherein subsequent to said heating and bending the curved windshield is subjected to a reducing environment at a temperature in excess of about 400° C.

50. The process of claim 48 wherein said indium-tin oxide film is exposed to a reducing environment during the time the glass windshield blank is subjected to said heating and bending.

* * * * *

UNITED STATES PATENT AND TRADEMARK OFFICE
CERTIFICATE OF CORRECTION

PATENT NO. : 4,490,227
DATED : December 25, 1984
INVENTOR(S) : Lowell E. Bitter

It is certified that error appears in the above-identified patent and that said Letters Patent is hereby corrected as shown below:

Column 2, line 51:

"interferring" should be --interfering--

Column 3, lines 6 & 7:

"substiochiometry" should be --substoichiometry--

Column 5, line 7:

"31" should be --40--

Column 6, line 42:

"perphaps" should be --perhaps--

Column 6, line 56:

"ward" should be --warm--

Column 7, line 16:

"oxideize" should be --oxidize--

Column 7, line 22:

"in" should be --is--

Column 7, line 43:

"in" should be --on--

UNITED STATES PATENT AND TRADEMARK OFFICE
CERTIFICATE OF CORRECTION

PATENT NO. : 4,490,227

DATED : December 25, 1984

INVENTOR(S) : Lowell E. Bitter

It is certified that error appears in the above-identified patent and that said Letters Patent is hereby corrected as shown below:

Column 8, line 32:

"cornes" should be --corners--

Column 8, line 38:

"bend" should be --bent--

Column 9, line 50:

"coating" should be --coated--

Column 12, Claim 21, line 10:

delete "and said coating is indium-tin oxide"

Column 12, Claim 33, line 44:

after "glass" insert --substrate--

Column 13, Claim 43, line 17:

UNITED STATES PATENT AND TRADEMARK OFFICE
CERTIFICATE OF CORRECTION

PATENT NO. : 4,490,227

DATED : December 25, 1984

INVENTOR(S) : Lowell E. Bitter

PAGE 3 of 3

It is certified that error appears in the above-identified patent and that said Letters Patent is hereby corrected as shown below:

"The" should be --A--

Signed and Sealed this

Twenty-seventh Day of August 1985

[SEAL]

Attest:

DONALD J. QUIGG

Attesting Officer

Acting Commissioner of Patents and Trademarks